US012745676B2

(12) United States Patent
Yoon et al.

(10) Patent No.: US 12,745,676 B2
(45) Date of Patent: Sep. 22, 2026

(54) SUBSTRATE FOR SEMICONDUCTOR PACKAGE AND SEMICONDUCTOR PACKAGE INCLUDING THE SAME

(71) Applicant: Samsung Electronics Co., Ltd., Suwon-si (KR)

(72) Inventors: Seongho Yoon, Suwon-si (KR); Sang Sub Song, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 504 days.

(21) Appl. No.: 18/331,977

(22) Filed: Jun. 9, 2023

(65) Prior Publication Data

US 2024/0194640 A1 Jun. 13, 2024

(30) Foreign Application Priority Data

Dec. 9, 2022 (KR) ........................ 10-2022-0171827

(51) Int. Cl.
*H10W 90/00* (2026.01)
*H10B 80/00* (2023.01)

(52) U.S. Cl.
CPC ............ *H10W 90/00* (2026.01); *H10B 80/00* (2023.02); *H10W 90/752* (2026.01); *H10W 90/753* (2026.01); *H10W 90/754* (2026.01)

(58) Field of Classification Search
CPC . H10W 90/00; H10W 90/752; H10W 90/753; H10B 80/00
See application file for complete search history.

(56) References Cited

U.S. PATENT DOCUMENTS 5,729,049 A * 3/1998 Corisis ................ H10W 70/413 257/E23.045
6,445,077 B1 * 9/2002 Choi .................. H10W 70/415 257/796
7,349,224 B2 * 3/2008 Ohsaka ................ H05K 1/0243 361/767
7,732,921 B2 * 6/2010 Fan ...................... H10W 70/68 257/737
7,829,985 B2 * 11/2010 Lee ....................... H05K 1/111 438/615
8,030,747 B2 * 10/2011 Lee ...................... H10W 90/00 257/777

(Continued)

FOREIGN PATENT DOCUMENTS

CN 1797758 A * 7/2006 .......... H10W 90/701
CN 102044517 B * 4/2013 ........ H10W 72/0198

(Continued)

*Primary Examiner* — Laura M Menz
(74) *Attorney, Agent, or Firm* — Wolf, Greenfield & Sacks, P.C.

(57) ABSTRACT

A substrate for a semiconductor package includes a semiconductor chip mounting region; a bonding terminal region including at least one bonding terminal; at least one plating line extending across the semiconductor chip mounting region; a plating line prohibition region at an opposite side of the bonding terminal region from the semiconductor chip mounting region; and a plating line removal region that is between the bonding terminal region and the semiconductor chip mounting region and is free of a portion of the plating line so that each of the at least one bonding terminal is electrically isolated.

15 Claims, 12 Drawing Sheets

(56) References Cited

U.S. PATENT DOCUMENTS 8,212,349 B2 * 7/2012 Hsu .................... H10W 70/60 257/692
8,369,884 B2 * 2/2013 Ishii .................... H04W 52/04 370/320
9,305,893 B1 * 4/2016 Park .................... H10W 72/50
10,615,053 B2 * 4/2020 Gardose .............. H10W 70/048
10,854,474 B2 * 12/2020 Gardose .............. H10W 70/048
10,879,160 B2 * 12/2020 Yu .................... H10W 70/685
10,950,512 B2 * 3/2021 Yu .................... H10W 70/05
11,282,811 B2 * 3/2022 Boo .................... H10W 70/685
11,929,351 B2 * 3/2024 Boo .................... H10W 70/685
2002/0030259 A1 * 3/2002 Choi .................... H10W 70/415 257/737
2006/0145343 A1 * 7/2006 Lee .................... H05K 1/111 257/737
2009/0093110 A1 * 4/2009 Lee .................... H05K 1/111 257/E21.536
2009/0108425 A1 * 4/2009 Lee .................... H10W 90/00 257/679
2009/0127716 A1 * 5/2009 Takatsuki ............ H10W 74/111 257/E23.079
2009/0243099 A1 * 10/2009 Fan .................... H10W 70/68 257/E23.024
2010/0041430 A1 * 2/2010 Ishii .................... H04L 5/0075 455/522
2010/0296329 A1 * 11/2010 Summerfelt ............ G11C 11/22 365/201
2011/0024919 A1 * 2/2011 Kang .................... H05K 1/111 257/782
2011/0156238 A1 * 6/2011 Hsu .................... H10W 70/60 257/692
2015/0091168 A1 * 4/2015 Choi .................... H10W 90/701 257/738
2015/0136858 A1 * 5/2015 Finn .................... G06K 19/07747 235/492
2019/0006266 A1 * 1/2019 Gomez .............. H10W 70/042
2019/0237376 A1 * 8/2019 Yu .................... H10W 70/05
2019/0237397 A1 * 8/2019 Yu .................... H10W 70/685
2019/0237398 A1 * 8/2019 Yu .................... H10W 70/05
2019/0378726 A1 * 12/2019 Gardose .............. H10W 70/048
2020/0234975 A1 * 7/2020 Gardose .............. H10W 70/048
2021/0056374 A1 * 2/2021 Lotya .................... H04B 5/77
2021/0159137 A1 * 5/2021 Yu .................... H10W 70/05
2021/0217731 A1 7/2021 Park
2021/0358888 A1 * 11/2021 Boo .................... H10W 70/685
2022/0181284 A1 * 6/2022 Shin .................... H10W 90/00
2022/0181307 A1 * 6/2022 Boo .................... H10W 70/685
2022/0278077 A1 9/2022 Park
2023/0215791 A1 * 7/2023 Kwon .................... H10W 70/65 257/668
2023/0343746 A1 * 10/2023 Park .................... H10W 90/00
2024/0136271 A1 * 4/2024 Lee .................... H10W 70/65
2024/0194640 A1 * 6/2024 Yoon .................... H10B 80/00
2024/0206181 A1 * 6/2024 Wang .................... H10B 43/40
2024/0234285 A9 * 7/2024 Lee .................... H10W 70/65
2025/0218968 A1 * 7/2025 Kim .................... H05K 1/111

FOREIGN PATENT DOCUMENTS

CN 104934405 B * 12/2017
CN 109148420 A * 1/2019 .......... H10W 74/014
CN 110581076 A * 12/2019 .......... H10W 70/465
CN 110858760 A * 3/2020 .......... H03F 3/195
CN 115148700 A * 10/2022 .......... H10W 70/65
CN 115312497 A * 11/2022 .......... H10W 70/618
CN 221994467 U * 11/2024
CN 110581121 B * 3/2025 .......... H10W 90/00
JP 2007266492 A 10/2007
JP 2013222954 A 10/2013
JP 2019040994 A * 3/2019
KR 100224721 B1 10/1999
KR 100247507 B1 3/2000
KR 20100041430 A * 4/2010 .......... H10W 90/701
KR 20110012706 A * 2/2011 .......... H10W 70/68
KR 10-2021-0090521 A 7/2021
KR 20210129546 A * 10/2021 .......... H10W 90/00
KR 20240086356 A * 6/2024 .......... H10W 90/00
KR 20240143591 A * 10/2024 .......... H01L 23/5386
KR 20250152718 A * 10/2025 .......... H10W 74/121
WO WO-2015144261 A1 * 10/2015 .......... G06K 19/07749

* cited by examiner 100
110
120
122
140
130
(a)
(b)

100
110
120
122
130
140
145
(a)
(b)

100
110
120a
130
120b
122
124
140a
140b
145
(a)
(b)

1000
1100
1200
1110
1450
1400
1220
1240
1120
1500

1000'
1100'
1120
1110
1450
1400
1220
1240
1200
1500

1000''
1100'
1120
1450
1500
1220
1500
1240

100
140
110
120
122
130
(a)
(b)

100
145
140
110
120
122
130
(a)
(b)

(b)

(a)

100
140
110
145
120
122
130
(a)
(b)

1000
1100
1120
1500
1400
1200
1110
1450
1220
1240

SUBSTRATE FOR SEMICONDUCTOR PACKAGE AND SEMICONDUCTOR PACKAGE INCLUDING THE SAME

CROSS-REFERENCE TO RELATED APPLICATION

This application claims priority to and the benefit of Korean Patent Application No. 10-2022-0171827 filed in the Korean Intellectual Property Office on Dec. 9, 2022, the entire content of which is incorporated herein by reference.

BACKGROUND OF THE INVENTION

(a) Field of the Invention

The present disclosure relates to a substrate for a semiconductor package and a semiconductor package including the same.

(b) Description of the Related Art

Packaging is an essential part of semiconductor manufacturing and design. Semiconductor devices continue to be developed with higher density integration and compactization. Even in packaging in which a semiconductor chip is mounted on a substrate, it may be desirable to shorten a wiring distance and increase a mounting density.

One of the semiconductor packaging methods includes mounting a semiconductor chip on a substrate, electrically connecting the semiconductor chip to the substrate by means of wire bonding, and molding the semiconductor chip with a resin such as an epoxy. The substrate includes terminals for connection with the semiconductor chip and terminals for connection with an external device. These terminals are typically plated with nickel or gold.

Electroplating is widely used to plate the terminals of the substrate. A plating line for electroplating is formed on the substrate for electrically connecting all terminals of the substrate. After the plating is completed, a portion of the plating line is removed so that all terminals are electrically isolated. Specifically, a plating line removal region including the portion of the plating line is set, and the portion of the plating line within the plating line removal region is removed by etching or the like to remove an electrical connection. However, a portion of a plating line outside the plating line removal region remains connected to the terminals, and the remnants (also referred to as a stub) of the plating line may adversely affect a signal characteristic of a semiconductor package.

Though the number of terminals increases with increasing density and compactization of a semiconductor, a size of the substrate is limited. Accordingly, the disposition of the plating line and setting of the plating line removal region is increasing in importance.

Conventionally, there have been various proposals for the disposition of the plating line and the setting of the plating line removal region, but the proposals are generally not suitable for application to newer semiconductor package shapes. The conventional proposals are suitable for a type of a package in which a relatively small semiconductor chip is mounted at a center of a relatively wide substrate, but may not be suitable for more modern semiconductor package shapes.

In particular, according to demand for compactization and high density integration, a package in which a relatively large semiconductor chip is mounted on a substrate of a limited size, a package in which two or more semiconductor chips are mounted on one substrate, a package in which two or more semiconductor chips are stacked and/or the like have been introduced. However, in these packages, there is a restriction on the disposition of the plating line and the setting of the plating line removal region. Currently, an optimal or desired design that may be applied to these packages has not been proposed.

SUMMARY

Embodiments of the present disclosure propose an optimal or desirable disposition of a plating line and an optimal or desirable setting of a plating line removal region applicable to a compact and highly integrated semiconductor package.

According to a first aspect of the present disclosure, a substrate for a semiconductor package is provided. The substrate for the semiconductor package includes: a semiconductor chip mounting region that is on one surface of the substrate and is configured for mounting a semiconductor chip thereon; a bonding terminal region that is next to the semiconductor chip mounting region with a distance therebetween, and includes at least one bonding terminal configured for connection to a bonding pad of the semiconductor chip by a wire; at least one plating line configured to supply electricity for electroplating, that is formed on the one surface of the substrate between the at least one bonding terminal and the semiconductor chip mounting region, and is connected to each of the at least one bonding terminal; a plating line prohibition region that is at an opposite side of the bonding terminal region from the semiconductor chip mounting region, and is configured to inhibit formation of the at least one plating line; and a plating line removal region that is between the bonding terminal region and the semiconductor chip mounting region, and is free of a portion of the at least one plating line so that each of the at least one bonding terminal is electrically isolated.

The semiconductor chip mounting region, the plating line removal region, the bonding terminal region, and the plating line prohibition region may be sequentially arranged in a length direction of the substrate, and the semiconductor chip mounting region, the plating line prohibition region, and the substrate have substantially a same width.

The plating line prohibition region may be configured as a second semiconductor chip mounting region for mounting a second semiconductor chip therein.

The substrate may further include a second bonding terminal region that is at an opposite side of the plating line prohibition region from the bonding terminal region, and includes at least one bonding terminal configured for connection to a bonding pad of the second semiconductor chip by a wire.

The substrate may further include at least one second plating line configured to supply electricity for electroplating, that extends from the at least one bonding terminal of the second bonding terminal region.

According to a second aspect of the present disclosure, a semiconductor package is provided. The semiconductor package includes: a substrate including a plurality of bonding terminals and a plating line on one surface of the substrate; a first semiconductor chip that is mounted on the one surface of the substrate and includes a plurality of bonding pads formed near at least one edge on a top surface of the first semiconductor chip; and a second semiconductor chip that is mounted on the one surface of the substrate at a distance from the first semiconductor chip, and includes a plurality of bonding pads formed near at least one edge on a top surface of the second semiconductor chip, wherein, the plurality of bonding terminals are between the first semiconductor chip and the second semiconductor chip and are connected to the plurality of bonding pads of the first semiconductor chip and the plurality of bonding pads of the second semiconductor chip by wires, the plating line is between the plurality of bonding terminals and the first semiconductor chip and is connected to each of the plurality of bonding terminals, and a plating line removal region is between the first semiconductor chip and the plurality of bonding terminals and is free of a portion of the plating line so that each of the plurality of bonding terminals is electrically isolated.

The first semiconductor chip, the plurality of bonding terminals, and the second semiconductor chip may be sequentially arranged in a length direction of the substrate, and the first semiconductor chip, the second semiconductor chip, and the substrate have substantially a same width. In some embodiments, each of the width of the first semiconductor chip and the width of the second semiconductor chip may be 80% or more of the width of the substrate. In other embodiments, each of the width of the first semiconductor chip and the width of the second semiconductor chip may be 90% or more of the width of the substrate, or a difference between the width of the first semiconductor chip (or the width of the second semiconductor chip) and the width of the substrate may be 150 μm or less.

A distance between the first semiconductor chip and the plurality of bonding terminals may be 500 μm to 600 μm.

The length of the removed plating line may be 100 μm to 200 μm.

After the portion of the plating line in the plating line removal region is removed, a length of the plating line that remains connected to each of the plurality of bonding terminals may be 200 μm or less.

The semiconductor package may further include a plurality of second bonding terminals that are at an opposite side of the second semiconductor chip from the plurality of bonding terminals and are connected to a plurality of bonding pads of the second semiconductor chip by wires.

The plating line may extend across a region of the top surface of the substrate in which the first semiconductor chip is mounted.

According to a third aspect of the present disclosure, a semiconductor package is provided.

The semiconductor package includes: a substrate that includes connection terminals on a bottom surface that are configured for connection with an external device, bonding terminals on a top surface, which are connected to a semiconductor chip by wires, and via holes and conductive lines configured to facilitate electrical connections to the connection terminals and the bonding terminals; and a first semiconductor chip and a second semiconductor chip that are arranged along a length direction of the substrate and have substantially a same width as a width of the substrate, wherein, a plurality of bonding pads are arranged along a width direction of the first semiconductor chip near one edge of a top surface thereof facing the second semiconductor chip, a plurality of bonding pads are arranged along a width direction of the second semiconductor chip near one edge of a top surface thereof facing the first semiconductor chip, a plurality of bonding terminals are arranged along a width direction of the substrate between the first semiconductor chip and the second semiconductor chip, the plurality of bonding terminals are connected to the plurality of bonding pads of the first semiconductor chip and the plurality of bonding pads of the second semiconductor chip by wires, all of the plurality of bonding terminals are connected to at least one plating line which is configured to supply electricity for electroplating, and is on the substrate between the plurality of bonding terminals and the first semiconductor chip, a plating line removal region, which is free of a portion of the at least one plating line, is between the first semiconductor chip and the plurality of bonding terminals to electrically separate the plurality of bonding terminals from each other, a distance between the second semiconductor chip and the plurality of bonding terminals is less than one-third of a distance between the first semiconductor chip and the plurality of bonding terminals, and the distance between the first semiconductor chip and the plurality of bonding terminals is 150 μm or more and the distance between the second semiconductor chip and the plurality of bonding terminals is 150 μm or less.

The distance between the first semiconductor chip and the plurality of bonding terminals may be 500 μm to 600 μm, and a length of the plating line removed by the plating line removal region may be 100 μm to 200 μm.

The length of the at least one plating line that is connected to the plurality of bonding terminals may be 200 μm or less.

In the second and third aspects of the present disclosure, the first semiconductor chip may be a memory chip, and the second semiconductor chip may be a buffer chip.

In the second and third aspects of the present disclosure, the first semiconductor chip may be a stack provided by stacking eight NAND flash memory chips, wherein the NAND flash memory chips are stacked in a stepwise manner so that the bonding pads of each of the NAND flash memory chips are arranged toward the plurality of bonding terminals. Herein, the stack, the at least one plating line, the plating line removal region, the plurality of bonding terminals, the buffer chip, and the plurality of second bonding terminals may constitute a first set, the semiconductor package may further include a second set that is adjacent to the first set and has a same configuration as the first set, and the first set and the second set may be symmetrical to each other.

The embodiments of the present disclosure may effectively achieve compactization and high integration while beneficially keeping a signal characteristic of a semiconductor package by disposition of a plating line and setting of a plating line removal region in which a length of the plating line remaining connected to bonding terminals is reduced or minimized in the semiconductor package in which a relatively large semiconductor chip is mounted on a substrate of a limited size.

DETAILED DESCRIPTION OF THE EMBODIMENTS

Figure 1:
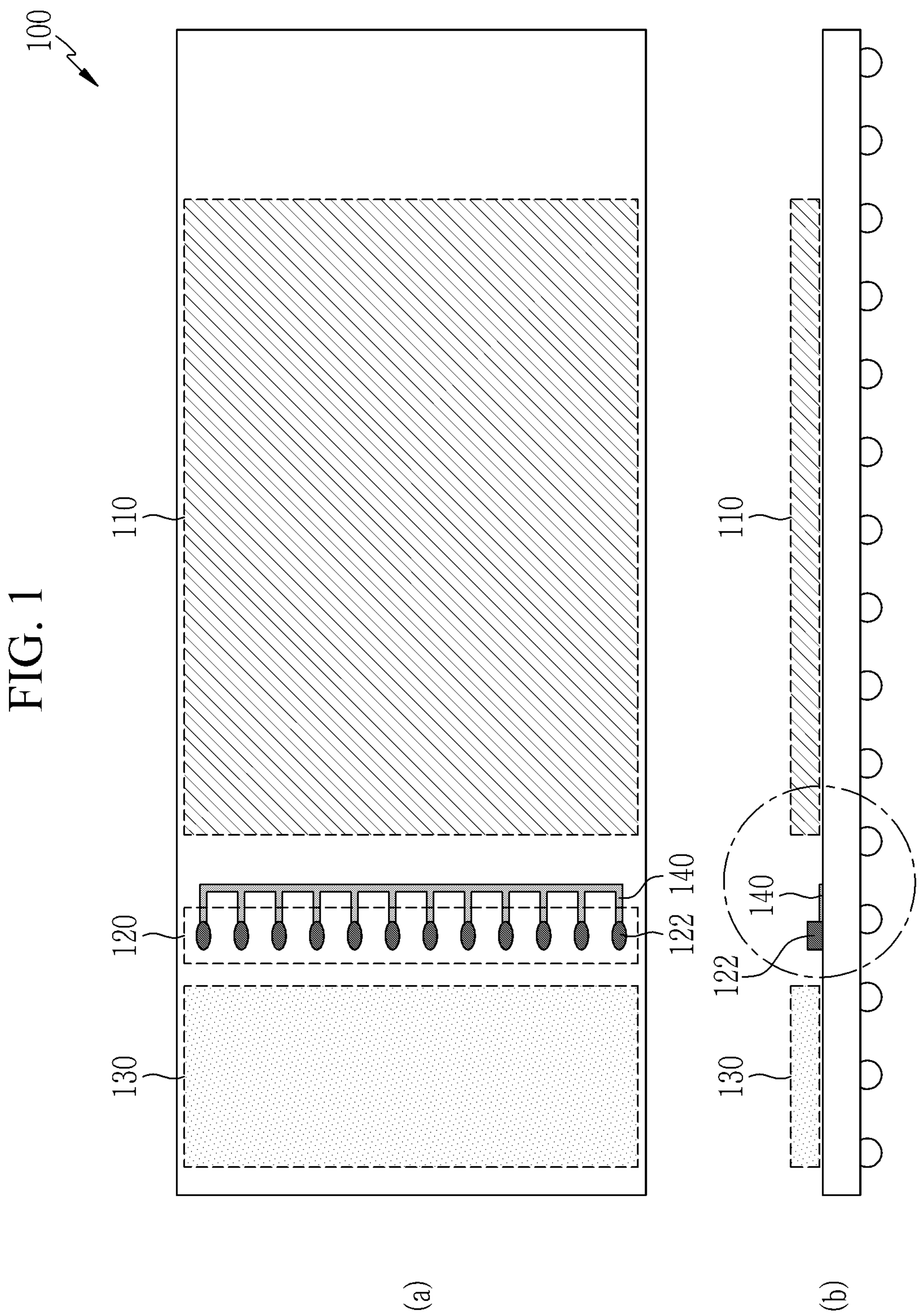
FIG. 1 is a schematic plan view and a schematic side view illustrating a state in which a substrate for a semiconductor package according to an embodiment of the present disclosure does not include a plating line removal region.

Hereinafter, example embodiments will be described with reference to the accompanying drawings. Accordingly, the drawings and description are to be regarded as illustrative in nature and not restrictive. The same reference numerals are used for the same components in the drawings, and duplicate descriptions thereof are omitted. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

In addition, because size and thickness of each component shown in the drawings and a ratio between components are arbitrarily adjusted for better understanding and ease of description, embodiments of the present disclosure is not limited thereto.

In addition, in the specification, unless explicitly described to the contrary, the word "comprise", and variations such as "comprises" or "comprising", will be understood to imply the inclusion of stated elements but not the exclusion of any other elements.

Further, in the specification, the phrase "on a plane" or in a "plan view" means when an object portion is viewed from above, and the phrase "in a side view" means when an object portion is viewed from the side.

FIG. 1 is a schematic plan view and a schematic side view illustrating a state before a plating line removal region is provided in a substrate for a semiconductor package according to an embodiment of the present disclosure.

The substrate 100 may be a printed circuit board. Although not shown in FIG. 1, terminals for connection with an external device may be provided at a bottom surface of the substrate 100. These terminals may have a shape of a bump or a ball, but embodiments are not limited thereto.

A semiconductor chip mounting region 110, a bonding terminal region 120, and a plating line prohibition region 130 are sequentially provided on a top surface of the substrate 100 along a length direction of the substrate 100. In the side view, the semiconductor chip mounting region 110 and the plating line prohibition region 130 are illustrated as having a certain height on the substrate, but this is only for convenience of explanation. The semiconductor chip mounting region 110 is a region on the substrate 100 to which a semiconductor chip is attached with an adhesive or the like. The plating line prohibition region 130 is a region on the substrate 100 in which formation of a plating line is prohibited.

Formation of the plating line is prohibited within the plating line prohibition region 130. That is, no plating line exists within the plating line prohibition region 130, and no plating line has been previously formed. Conventionally, a pattern of the plating line is formed for electroplating, and then a portion of the pattern is removed by etching or the like after electroplating. However, a surface of a region from which the plating line is removed is not the same as a surface before forming the plating line pattern. When a treatment, such as etching or the like is performed on a surface to remove the plating line, a physical and/or chemical property of the surface is changed. Accordingly, when a semiconductor chip is bonded to the surface, the adhesive force facilitating the bonding may be degraded. Such a change in a surface characteristic due to a process of forming the pattern of the plating line and then removing a portion of the pattern does not occur in the plating line prohibition region 130. Therefore, the plating line prohibition region 130 does not cause a problem of low adhesion when another semiconductor chip or another part is bonded, and may be used as a space for forming another complex circuit pattern.

A plurality of bonding terminals 122 are provided within the bonding terminal region 120. Although FIG. 1 shows a limited number of bonding terminals 122, in practice, a large number of bonding terminals 122 are disposed at a high density with fine intervals in the bonding terminal region 120. The plating line 140 extends from one side of the bonding terminal region 120 toward the semiconductor chip mounting region 110, since the plating line prohibition region 130 is disposed at an opposite side of the bonding terminal region 120. The plating line is formed between the semiconductor chip mounting region 110 and the bonding terminal region 120, and is connected to each of the bonding terminals 122.

The bonding terminals 122 may protrude upward from the top surface of the substrate 100 or may be recessed inward from the top surface. The bonding terminals 122 are also referred to as lead fingers, connection pads, or the like, and may have various shapes. Although not shown in FIG. 1, the bonding terminals 122 may be respectively connected to bumps below the substrate 100 through wires and via holes.

The substrate 100 has the semiconductor chip mounting region 110 on the top surface of the substrate on which the semiconductor chip is to be mounted. The semiconductor chip is attached to the semiconductor chip mounting region 110 using an adhesive or the like.

A width of the semiconductor chip mounting region 110 is substantially the same as that of the substrate 100. An embodiment where the width of the semiconductor chip mounting region is substantially the same as that of the substrate includes not only an embodiment where the width of the semiconductor chip mounting region 110 is completely identical to that of the substrate 100 but also an embodiment where the width of the semiconductor chip mounting region 110 is smaller than that of the substrate 100 and a space between the semiconductor chip mounting region 110 and the substrate 100 is so small that it is difficult to form conductive lines or the like thereon. For example, a difference between the width of the semiconductor chip mounting region 110 and the width of the substrate 100 may be 150 μm or less. In an embodiment, the width of the semiconductor chip mounting region may be 80% or more of the width of the substrate, and, in some embodiments, the width of the semiconductor chip mounting region may be 90% or more of the width of the substrate.

A size of a semiconductor package may be limited by a requirement of a device on which the semiconductor package is mounted. An information device may be required to be thin and multi-functional, and thus, compactization and high density integration may be required for the semiconductor package. Therefore, a substrate for the semiconductor package may have a limited size, while a size of a semiconductor chip of a large capacity is relatively large. The present embodiment may enable a large-capacity semiconductor chip to be mounted on the substrate 100 by providing a maximum width of the semiconductor chip mounting region 110.

The substrate 100 includes the plating line 140 for plating the bonding terminals 122. The plating line 140 is connected to all the bonding terminals 122 to be plated, and extends from the bonding terminals 122 toward the semiconductor chip mounting region 110. In FIG. 1, the plating lines 140 extend from all the bonding terminals 122 and then are connected to each other. However, a pattern of the plating line 140 is not limited to a pattern shown in FIG. 1. Because the plating line 140 is configured to perform electroplating by supplying electricity to all the bonding terminals 122, any pattern that may achieve this purpose may be used.

To connect an external power supply device and the plating line 140, an extension line of the plating line may be formed outside the substrate 100 after the plating lines are connected to each other. In other embodiments, the plating line 140 may be connected to a ground line provided on the substrate 100, and power for electroplating may be supplied through the ground line.

Although the pattern of the plating line 140 for supplying external power for electroplating may be designed in various ways, it should be considered that a portion of the plating line may be removed so that the bonding terminals 122 are electrically isolated from each other after completion of electroplating. The portion of the plating line 140 may be removed by etching. A process of setting a region for removing the portion of the plating line and removing the plating line within the set region by the etching is called etching back. Thus, a plating line removal region may be free of a portion of one or more plating lines 140 to electrically isolate the bonding terminals 122.

Setting the plating line removal region is an important design consideration. In an embodiment of the present disclosure, a state in which the plating line removal region is formed is shown in FIG. 2.

Figure 2:
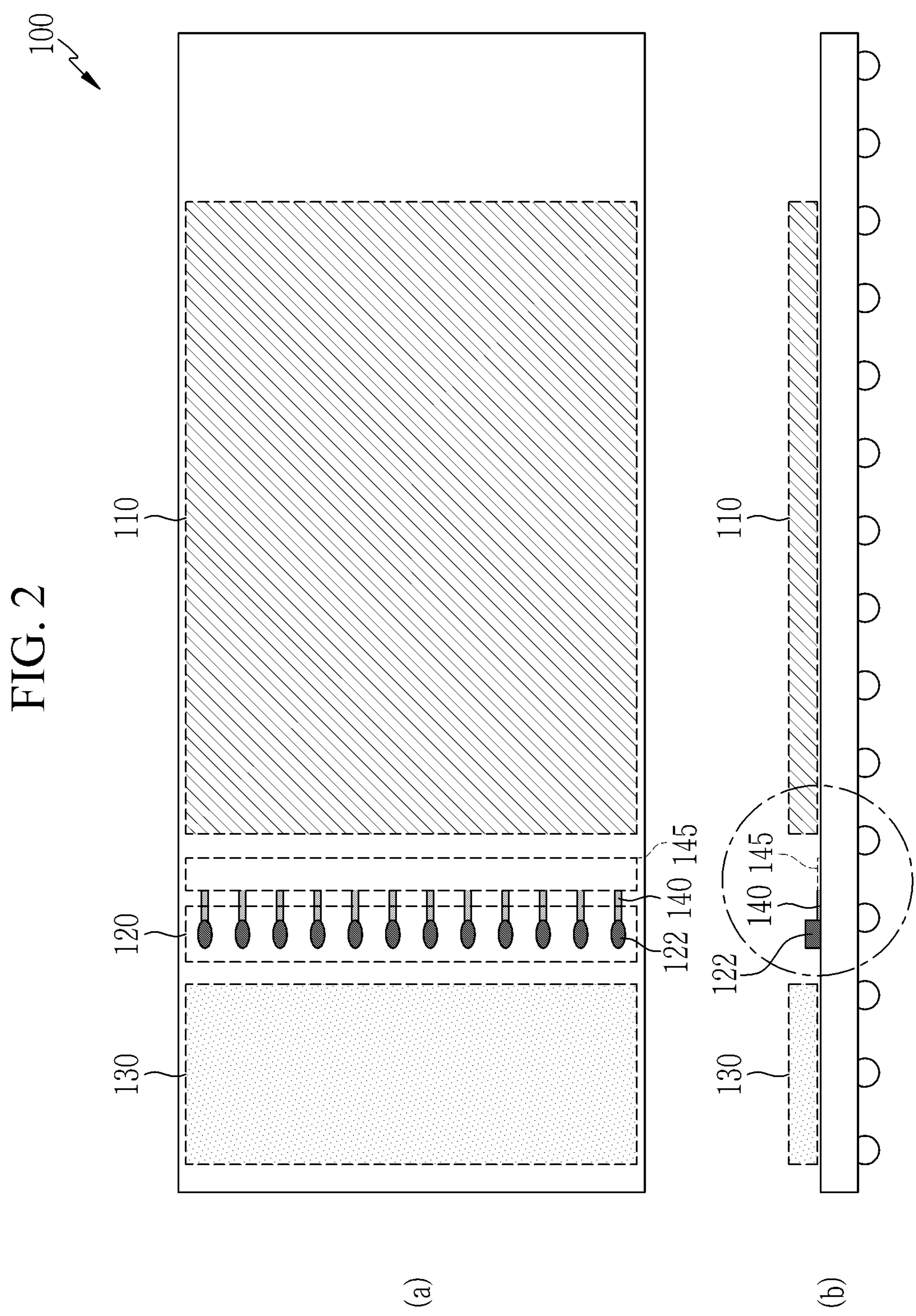
FIG. 2 is a schematic plan view and a schematic side view illustrating a state in which the plating line removal region is provided at the substrate for the semiconductor package according to an embodiment of the present disclosure.

Referring to FIG. 2, the plating line removal region 145 is disposed between the semiconductor chip mounting region 110 and the bonding terminal region 120. A portion of the plating line within the plating line removal region 145 is removed by a treatment, such as etching or the like. Thereby, the bonding terminals 122 are electrically isolated from each other.

To provide the plating line removal region 145 between the semiconductor chip mounting region 110 and the bonding terminal region 120, a distance between the semiconductor chip mounting region 110 and the bonding terminal region 120 is set greater than a distance between the plating line prohibition region 130 and the bonding terminal region 120. In an embodiment, the distance between the plating line prohibition region 130 and the bonding terminal region 120 is less than one-third of the distance between the semiconductor chip mounting region 110 and the bonding terminal region 120.

A length of a plating line stub that remains connected to the bonding terminals 122 after the portion of the plating line is removed by the plating line removal region 145 is reduced or minimized by disposing the plating line removal region 145 between the semiconductor chip mounting region 110 and the bonding terminal region 120. Because the plating line stub affects a signal characteristic, it is generally desirable to leave the plating line stub as short as possible.

In a comparative example described with reference to FIGS. 8 and 9, the plating line removal region 145 is disposed at an opposite side of the semiconductor chip mounting region 110 from the bonding terminals 122. In this embodiment, a plating line stub connected to the bonding terminals 122 remains across the semiconductor chip mounting region 110. This may degradation of the signal characteristic as will be described below.

Figure 3:
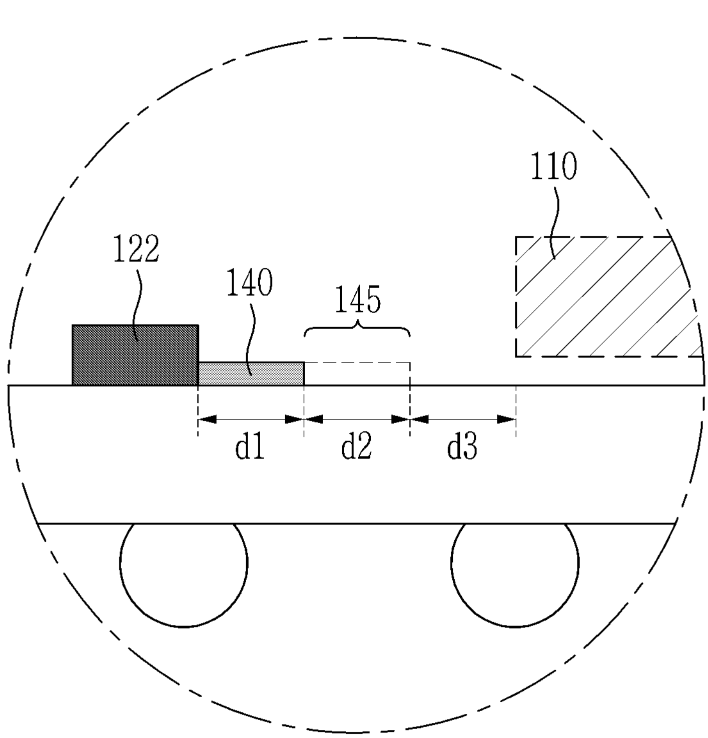
FIG. 3 is a partially enlarged view of a circled portion in FIG. 2.

FIG. 3 is a partially enlarged view of a circled portion in FIG. 2. The plating line removal region 145 is disposed between the bonding terminals 122 and the semiconductor chip mounting region 110. The plating line 140 is partially cut by the plating line removal region 145.

In an embodiment, a distance (d1+d2+d3) between the semiconductor chip mounting region 110 and the plurality of bonding terminals is 500 μm to 600 μm. A width (d2) of the plating line removal region 145 according to the length direction of the substrate 100 is 100 μm to 200 μm.

In an embodiment, a length (d1) of the plating line stub remaining connected to the bonding terminals 122 after the plating line is partially removed is about 200 μm. In this embodiment, the width (d2) of the plating line removal region 145 according to the length direction of the substrate 100 is about 150 μm, and a distance (d3) between the plating line removal region 145 and the semiconductor chip mounting region 110 is about 200 μm. These dimensions may be suitable for stably providing the plating line removal region 145 by an etching process without affecting the bonding terminals 122 and the semiconductor chip mounting region 110.

According to the present embodiment, by reducing or minimizing the length of the plating line stub while providing the largest region where the semiconductor chip is mounted, there is no or reduced deterioration in a signal characteristic due to formation and removal of the plating line, and the substrate for the semiconductor package may have a high-density layout and may also provide a region for mounting an additional semiconductor chip.

Figure 4:
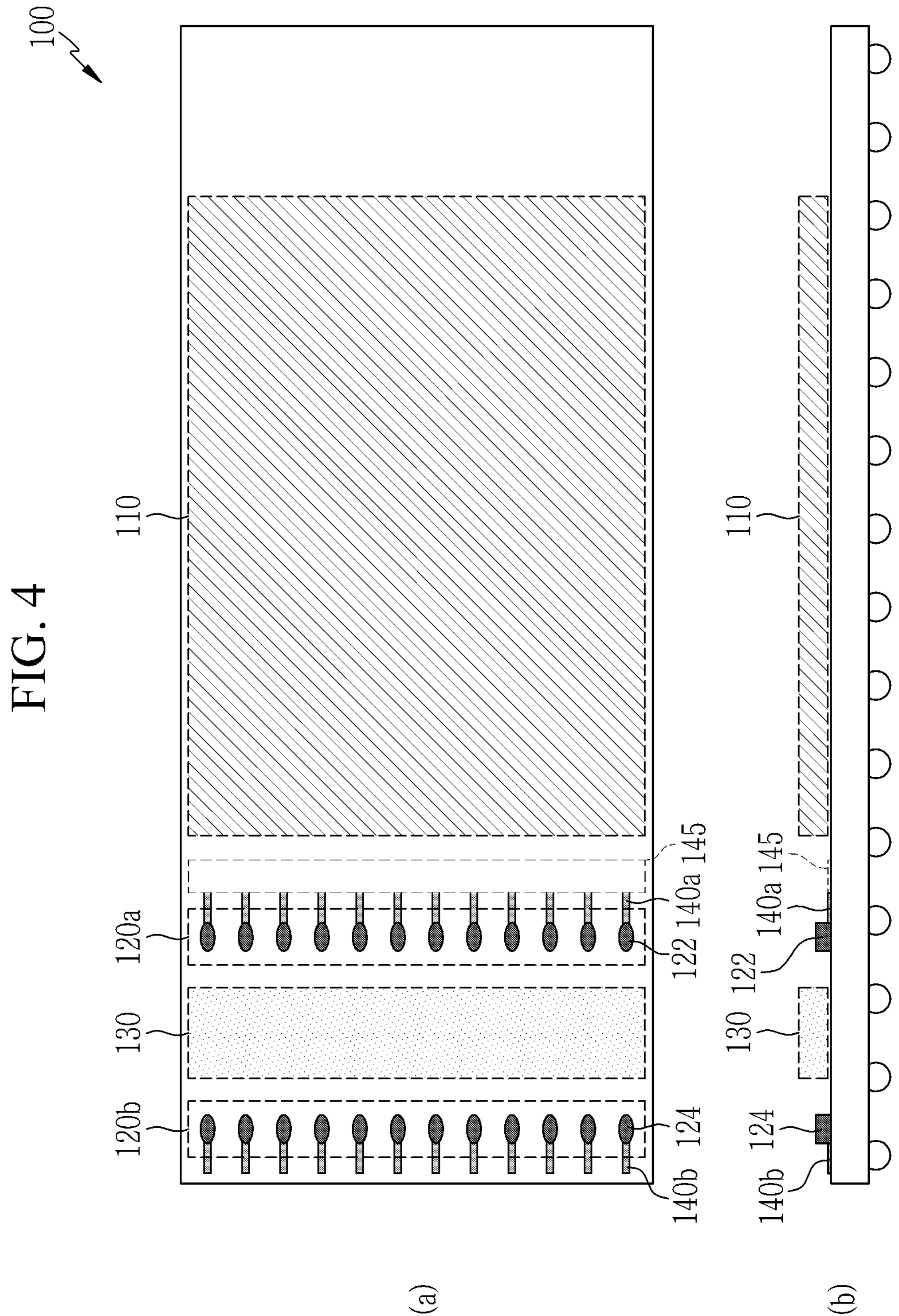
FIG. 4 is a schematic plan view and a schematic side view of a substrate for a semiconductor package according to another embodiment of the present disclosure.

FIG. 4 is a schematic plan view and a schematic side view of a substrate for a semiconductor package according to another embodiment of the present disclosure. Like the substrate of FIG. 2, the substrate 100 includes the semiconductor chip mounting region 110, the plating line removal region 145, a bonding terminal region 120*a*, and a plating line 140*a*. Because the description of features with reference to FIGS. 2 and 3 may be applicable to these configurations, a repeated description thereof is omitted.

A bonding terminal region 120*b* including bonding terminals 124 and a plating line 140*b* connected to the bonding terminals 124 are provided at an opposite side of the plating line prohibition region 130 from the bonding terminal region 120*a*. In addition, the plating line prohibition region 130 is a second semiconductor chip mounting region on which a second semiconductor chip is mounted.

The bonding terminals 124 within the bonding terminal region 120*b* are connected to bonding pads of the semiconductor chip mounted on the second semiconductor chip mounting region 130 by wires. Because the plating line 140*b* is disposed at an edge of the substrate 100, a degree of freedom in designing a pattern of the plating line is high. Although a limited number of bonding terminals are shown in FIG. 4 for simplicity of explanation, many conductive lines may be provided on the substrate in addition to the bonding terminals, and thus a pattern connecting the bonding terminals to the plating line may be adaptively designed.

According to the present embodiment, a substrate capable of mounting two semiconductor chips with high space efficiency while reducing or minimizing an influence of the plating line on a signal characteristic is provided.

Figure 5:
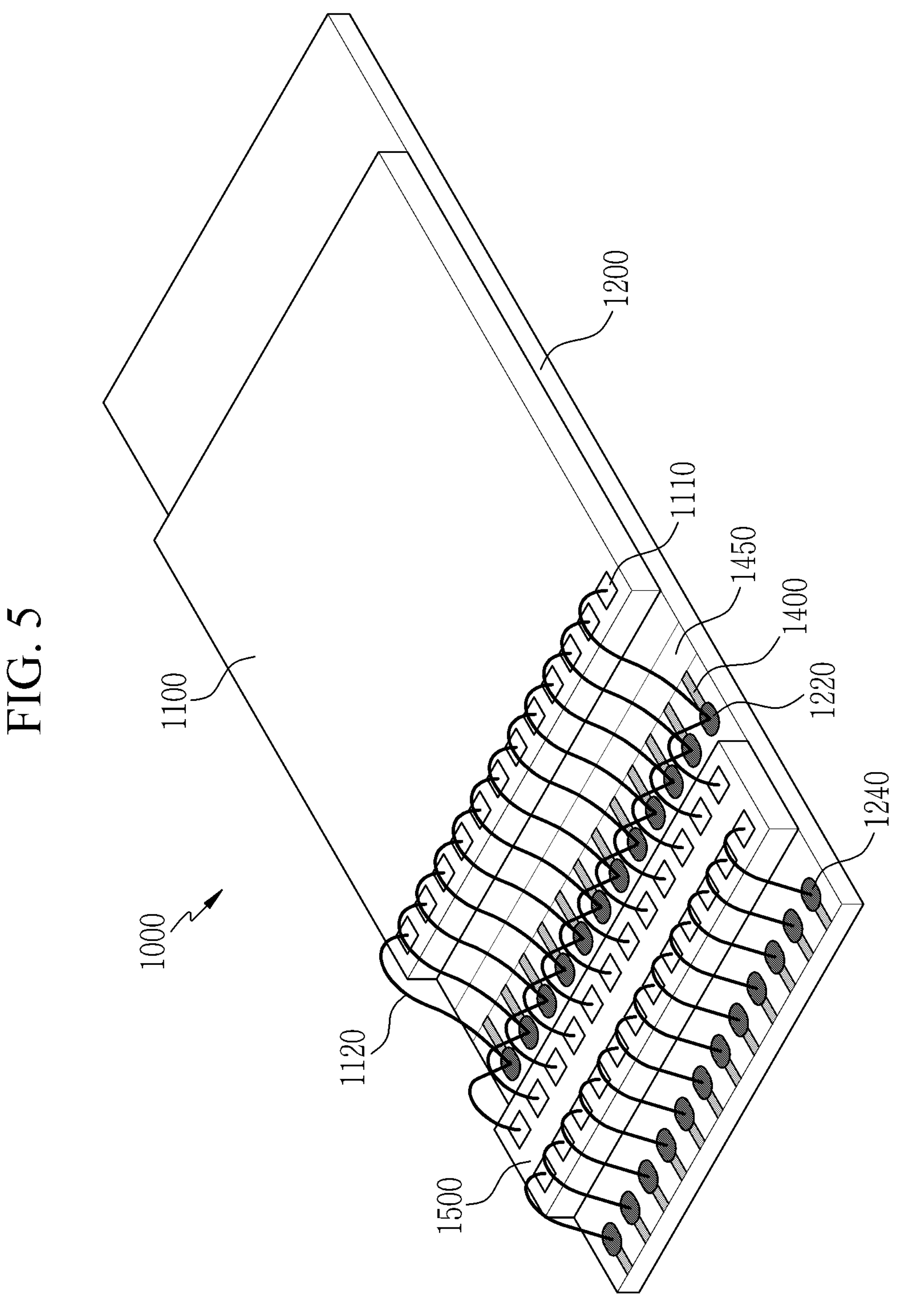
FIG. 5 is a perspective view illustrating a semiconductor package according to an embodiment of the present disclosure.

FIG. 5 is a perspective view illustrating a semiconductor package according to an embodiment of the present disclosure. The semiconductor package 1000 includes a substrate 1200 and a first semiconductor chip 1100 and a second semiconductor chip 1500 mounted on the substrate 1200. A basic structure of the substrate 1200 is substantially the same as that of the substrate 100 shown in FIG. 4. Although not shown in FIG. 5, the semiconductor package 1000 may include a molding layer on and at least partially covering the first semiconductor chip 1100 and the second semiconductor chip 1500 to protect the semiconductor chips from impact, humidity, temperature, and the like. For example, the molding layer may include an insulating resin or an epoxy molding compound (EMC).

The first semiconductor chip 1100 and the second semiconductor chip 1500 are mounted along a length direction of the substrate 1200. A width of the first semiconductor chip 1100 is equal to or slightly smaller than that of the substrate 1200. In an embodiment, a difference between a width of the first semiconductor chip 1100 and a width of the substrate 1200 is 150 μm or less. A width of the second semiconductor chip 1500 is substantially the same as that of the substrate 1200. In an embodiment, each of the width of the first semiconductor chip 1100 and the width of the second semiconductor chip 1500 may be 80% or more of the width of the substrate 1200, and in some embodiments, may be 90% or more.

In an embodiment, at least one of the first semiconductor chip 1100 and the second semiconductor chip 1500 may have a sufficiently smaller width than that of the substrate 1200. In this case, there may be a space on the substrate at one side or both sides of the first semiconductor chip 1100 and/or the second semiconductor chip 1500 in a width direction. This space may be filled with another circuit pattern or another component for high integration.

In the present embodiment, a plurality of bonding pads 1110 are provided on a top surface of the first semiconductor chip 1100. The bonding pads 1110 are connected to first bonding terminals 1220 on the substrate 1200 by wires 1120. A length of the wire 1120 may be relatively short to suppress a signal delay. To meet such requirement, the bonding pads 1110 are arranged near one edge proximal to the first bonding terminals 1220 on a top surface of the first semiconductor chip 1100.

The first bonding terminals 1220 are arranged in a width direction between the first semiconductor chip 1100 and the second semiconductor chip 1500. Because a plating line removal region 1450 is provided between the first semiconductor chip 1100 and the first bonding terminals 1220, a distance between the first semiconductor chip 1100 and the first bonding terminals 1220 is about three times greater than a distance between the second semiconductor chip 1500 and the first bonding terminals 1220. In this embodiment, the distance between the first semiconductor chip 1100 and the first bonding terminals 1220 is 150 μm or more, and the distance between the second semiconductor chip 1500 and the first bonding terminals 1220 is 150 μm or less.

Although it is generally desirable that the distance between the second semiconductor chip 1500 and the first bonding terminals 1220 be as short as possible, the distance between the first semiconductor chip 1100 and the first bonding terminals 1220 may be a certain distance long enough to stably provide the plating line removal region 1450. In an embodiment, the certain distance is 500 μm to 600 μm.

A plating line 1400 is provided between the first bonding terminals 1220 and the first semiconductor chip 1100, and is connected to each of the first bonding terminals 1220. A portion of the plating line is removed after electroplating, and the remaining portion of the plating line remains unremoved. After a portion of the plating line is removed, the remaining portion of the plating line is still connected to the first bonding terminals 1220, and is called a plating line stub The shorter a length of the plating line stub is, the less an influence is of a signal characteristic. In an embodiment, the length of the plating line stub is 200 μm or less.

Because a physical/chemical characteristic of a surface changes when the plating line within the plating line removal region is removed by an etching process, if the plating line removal region is provided below the first semiconductor chip 1100, adhesion of the first semiconductor chip 1100 may be adversely affected. If the plating line removal region 1450 is provided between the first semiconductor chip 1100 and the bonding terminals 1220 as in the embodiment of the present disclosure, the above problem may not occur.

Figure 9:
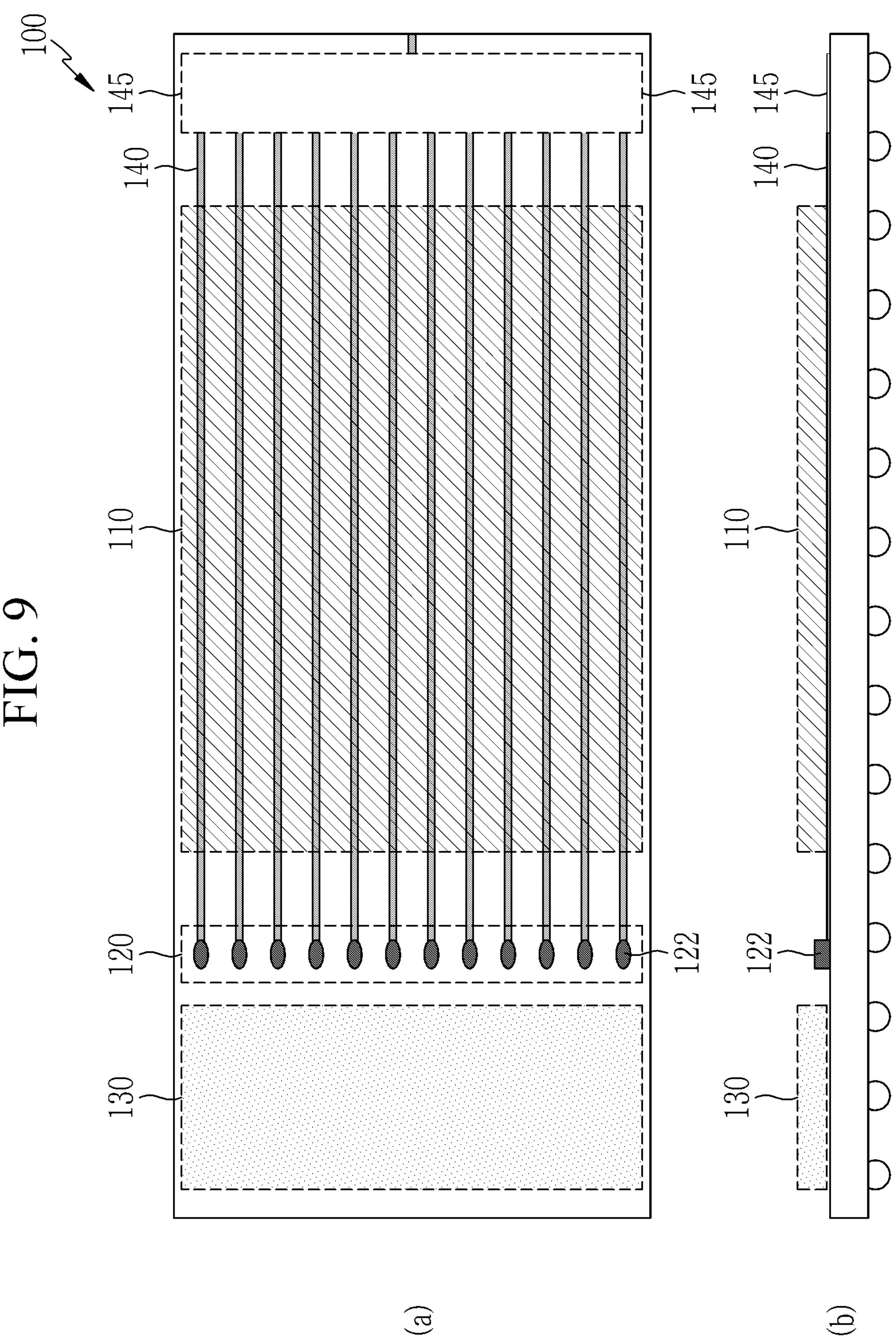
FIG. 9 is a plan view and a side view schematically illustrating the substrate for the semiconductor package in a state in which a plating line removal region is provided in the comparative example of FIG. 8.

In addition, when the plating line removal region is provided at an opposite side of the first semiconductor chip from the bonding terminals as shown in FIG. 9, the plating line may extend below the first semiconductor chip. In this case, the plating line stub may become relatively long, and signal characteristics may be adversely affected. If the plating line removal region is provided between the first semiconductor chip and the bonding terminals as in an embodiment of the present disclosure, the above problem may not occur because the length of the plating line stub remains relatively short.

A plurality of bonding pads are arranged on a top surface of the second semiconductor chip 1500 near one edge proximal to the first semiconductor chip 1100, and the plurality of bonding pads are connected to the first bonding terminals 1220 by wires.

In an embodiment, second bonding terminals 1240 may be disposed at an opposite side of the second semiconductor chip 1500 from the first bonding terminals 1220. The second bonding terminals 1240 are connected to bonding pads provided on the top surface of the second semiconductor chip 1500 by wires. A separate plating line for plating the second bonding terminals 1240 may be formed. A pattern of the plating line and a plating line removal region for the second bonding terminals 1240 may be appropriately set in various ways.

In an embodiment, the first semiconductor chip may be a memory chip and the second semiconductor chip may be a buffer chip. In another embodiment, the first semiconductor chip may be a memory chip and the second semiconductor chip may be a controller chip. Alternatively, the second semiconductor chip may be a memory chip and the first semiconductor chip may be a buffer chip or a controller chip.

In an embodiment, the memory chip may be a NAND flash memory chip. When the first semiconductor chip is the memory chip, a width of the memory chip may have a maximum value allowed by the substrate so that the memory chip may have a maximum capacity while being mounted on the substrate having a limited size.

Figure 6:
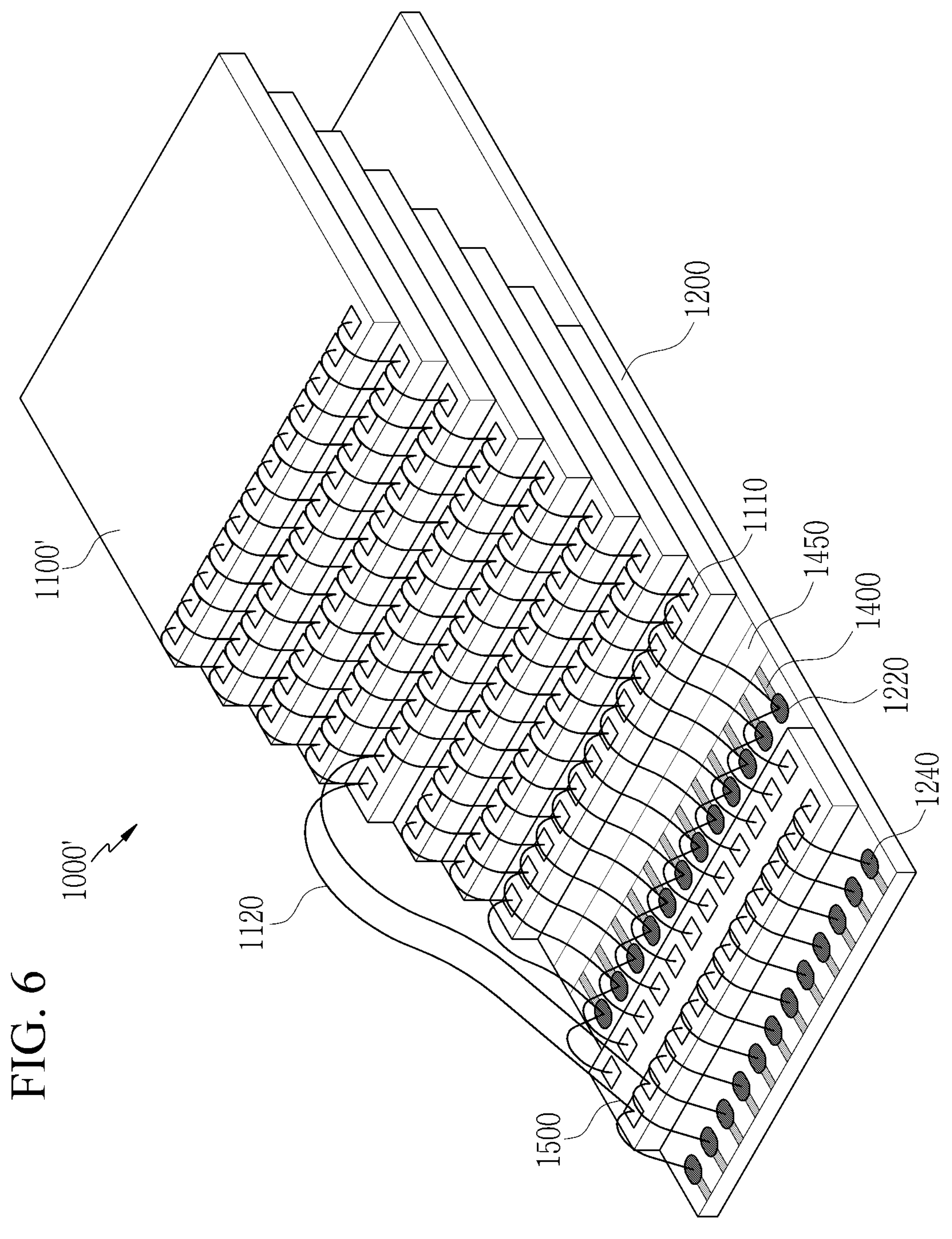
FIG. 6 is a perspective view illustrating a semiconductor package according to another embodiment of the present disclosure.

FIG. 6 is a schematic perspective view of a semiconductor package according to another embodiment of the present disclosure. The semiconductor package 1000' of the present embodiment includes a semiconductor chip stack 1100' in which a plurality of first semiconductor chips are stacked in a chip-on-chip type. In FIG. 6, the semiconductor chip stack 1100' includes eight semiconductor chips, but this is merely an example, and for example, the semiconductor chip stack 1100' may include four or sixteen semiconductor chips. The second semiconductor chip 1500 is mounted on the substrate 1200, and the first and second bonding terminals 1220 and 1240 are respectively provided on both sides of the second semiconductor chip 1500.

The plating line removal region 1450 is provided between the semiconductor chip stack 1100' and the first bonding terminals 1220. Because the embodiment of FIG. 5 can be referred to for description of the remaining components except for the semiconductor chip stack, a detailed description of the remaining components is omitted herein.

Because a plurality of semiconductor chips are stacked in a stepwise manner in the semiconductor chip stack 1100', bonding pads are provided on a top surface of each semiconductor chip near one edge thereof. In the present embodiment, the bonding pads of each semiconductor chip are arranged near one edge proximal to the first bonding terminals 1220.

In an embodiment, the semiconductor chip stack 1100' is a stack of memory chips and the second semiconductor chip 1500 is a buffer chip. Alternatively, the second semiconductor chip 1500 may be a controller chip. The memory chip may be a NAND flash memory chip. To maximize storage capacity, a chip stack may be provided by stacking NAND flash memory chips in a chip-on-chip form. As shown in FIG. 6, the semiconductor chip stack 1100' may include eight NAND flash memory chips.

To maximize storage capacity, the number of cells in the memory chip may increase. This means that a size of the memory chip increases. However, there is a limitation that the size of the memory chip may not be greater than a size of a substrate for a package of the memory chip. This limitation may be overcome by vertically stacking memory chips. The present embodiment may improve or optimize disposition of the plating line and setting of the plating line removal region so that it is configured to mount the memory chip having a width as large as a width of the substrate. Furthermore, the present embodiment may increase or maximize storage capacity by stacking a plurality of memory chips.

Figure 7:
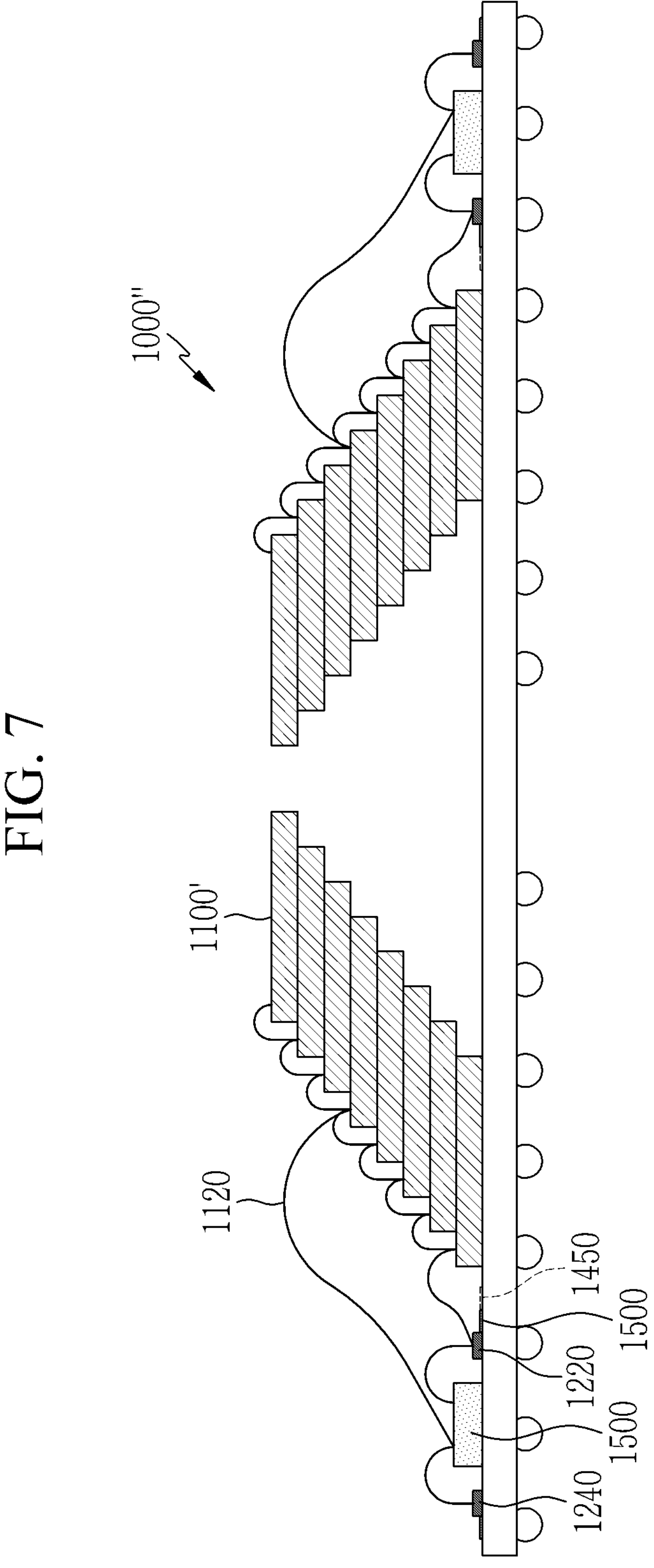
FIG. 7 is a schematic side view illustrating a semiconductor package according to another embodiment of the present disclosure.

FIG. 7 is a schematic side view of a semiconductor package according to another embodiment of the present disclosure. The semiconductor package 1000" of the present embodiment includes a pair of semiconductor chip stacks 1100'. The pair of the semiconductor chip stacks 1100' are disposed in mirror symmetry with each other. The first bonding terminals 1220 connected to each semiconductor chip stack 1100', the second semiconductor chip 1500, the second bonding terminals 1240, the plating line 1400, and the plating line removal region 1450 are also disposed on the substrate in mirror symmetry with each other.

The configuration and arrangement of the first bonding terminals, the second semiconductor chip, the second bonding terminals, the plating line, and the plating line removal region disposed on both sides of the substrate, have been described with respect to the previous embodiments, a repeated description thereof is omitted.

In an embodiment, each of the pair of semiconductor chip stacks 1100' may be a stack in which eight NAND flash memory chips are stacked. Thus, sixteen NAND flash memory chips may be included in one semiconductor package. The pair of flash memory chip stacks may operate with two channels. The second semiconductor chip may be a buffer chip or a controller chip.

Figure 8:
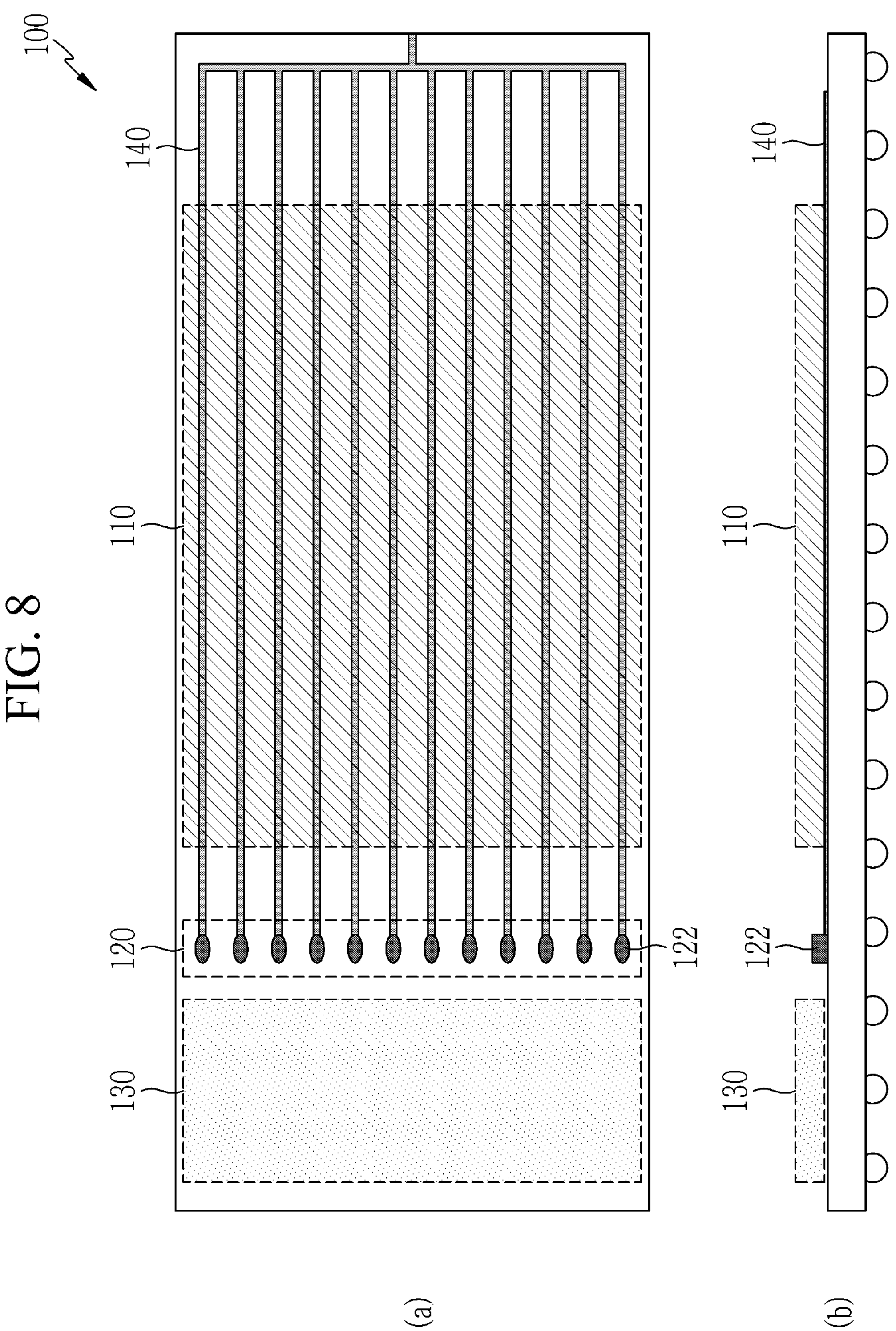
FIG. 8 is a schematic plan view and a schematic side view illustrating a state in which a plating line is provided at a substrate for a semiconductor package according to a comparative example.
Figure 10:
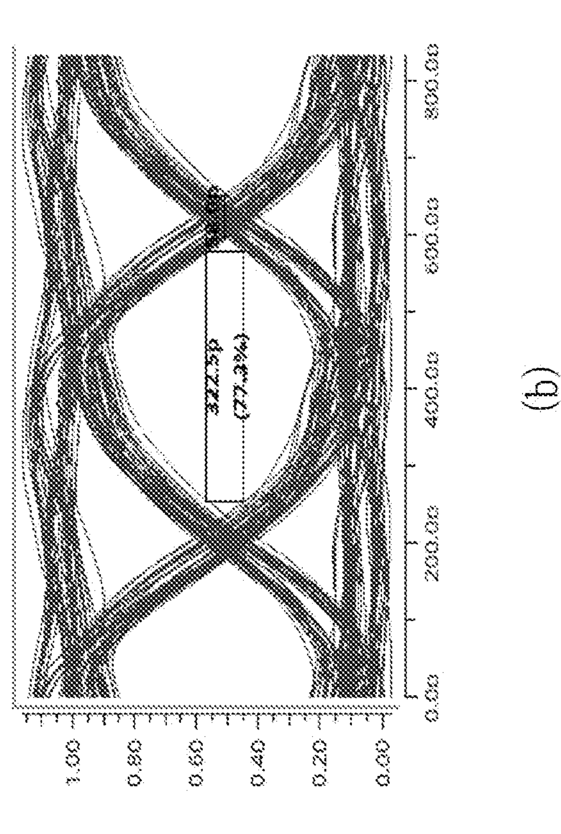
FIG. 10 is a graph illustrating a signal characteristic of a semiconductor package according to an embodiment of the present disclosure compared with that of the comparative example.
Figure 10:
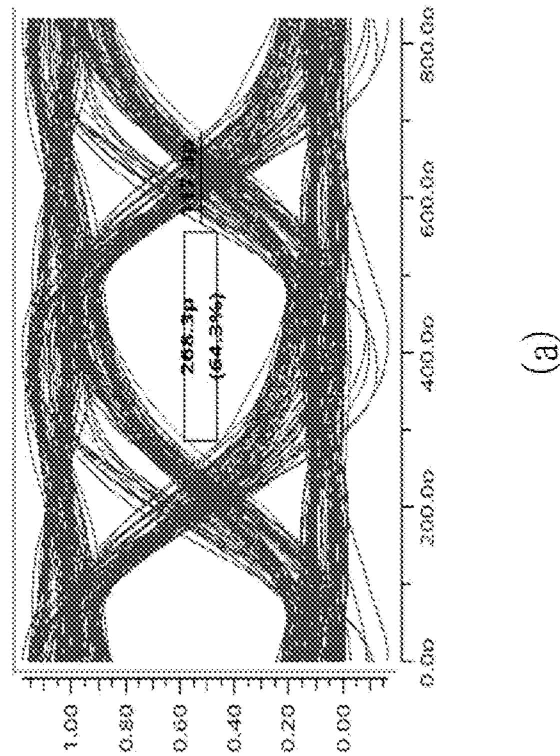

FIGS. 8 to 10 show the comparative example and a comparative experimental result for describing signal characteristics of embodiments of the present disclosure.

Referring to FIG. 8, the semiconductor chip mounting region 110, the bonding terminal region 120, and the plating line prohibition region 130 are sequentially disposed on a substrate for a semiconductor package along a length direction of the substrate, and this configuration is the same as that of the embodiment of FIG. 1.

On the other hand, in the comparative example, the plating line 140 extends across the semiconductor chip mounting region 110. As shown in FIG. 9, in the comparative example, the plating line removal region 145 is provided at an opposite side of the semiconductor chip mounting region 110. That is, the plating line removal region 145 is disposed at an opposite side of the semiconductor chip mounting region 110 from the bonding terminal region 120.

In an example where the plating line removal region 145 overlaps the semiconductor chip mounting region 110, as described above, a problem in which an adhesive force of the semiconductor chip is weakened may occur. In the comparative example, the plating line removal region 145 is disposed outside the semiconductor chip mounting region 110, and the bonding terminals 122 are electrically separated by removing a portion of the plating line 140 within the plating line removal region 145.

A position of the plating line removal region 145 of the comparative example of FIG. 9 is different from that of the plating line removal region 145 of the embodiment of FIG. 2 when the comparative example of FIG. 9 is compared with the embodiment of FIG. 2. For this reason, a distance between the semiconductor chip mounting region 110 and the bonding terminal region 120 of the comparative example of FIG. 9 may be shorter than that of the embodiment of FIG. 2. However, as can be seen from an experimental result of FIG. 10, an advantage obtained by shortening the distance between the semiconductor chip mounting region 110 and the bonding terminal region 120 is significantly lower than an advantage obtained by providing the plating line removal region 140 between the semiconductor chip mounting region 110 and the bonding terminal region 120.

FIG. 10 shows measurement results of an input-output signal characteristic of the semiconductor package including the substrate for the semiconductor package shown in FIG. 2 and an input-output signal characteristic of the semiconductor package including the substrate for the semiconductor package shown in FIG. 9.

In this comparison experiment, a NAND flash memory chip is mounted at the semiconductor chip mounting region, and a buffer chip is mounted at the plating line prohibition region 130. Two semiconductor packages used in the experiment had the same configuration except for a position of the plating line removal region 145. In FIG. 10, (a) is the measurement result of the input-output signal characteristic of the semiconductor package manufactured according to an arrangement structure shown in FIG. 9, and (b) is the measurement result of the input-output signal characteristic of the semiconductor package manufactured according to an arrangement structure shown in FIG. 2.

From the measurement results, it is easy to see that the input-output signal characteristics of FIG. 10 (*b*) are superior to those of FIG. 10 (*a*). In the semiconductor package according to the comparative example, a length of the plating line stub remaining connected to each bonding terminal 122 is relatively long. A long plating line stub unnecessarily acts as an antenna or causes a problem in which a signal is reflected so that it deteriorates an overall signal characteristic of the semiconductor package.

Figure 11:
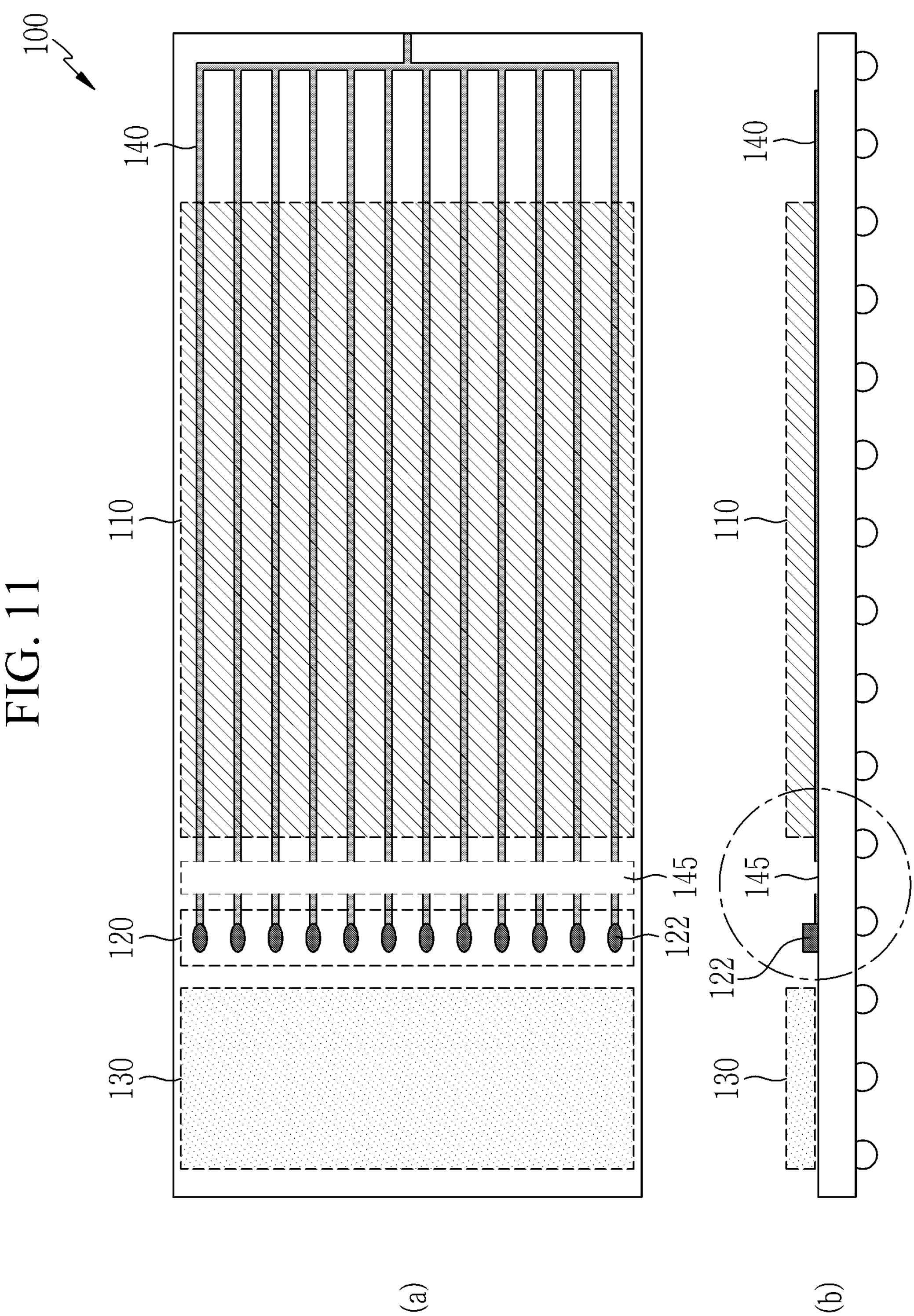
FIG. 11 is a schematic plan view and a schematic side view of a substrate for a semiconductor package according to another embodiment of the present disclosure.
Figure 12:
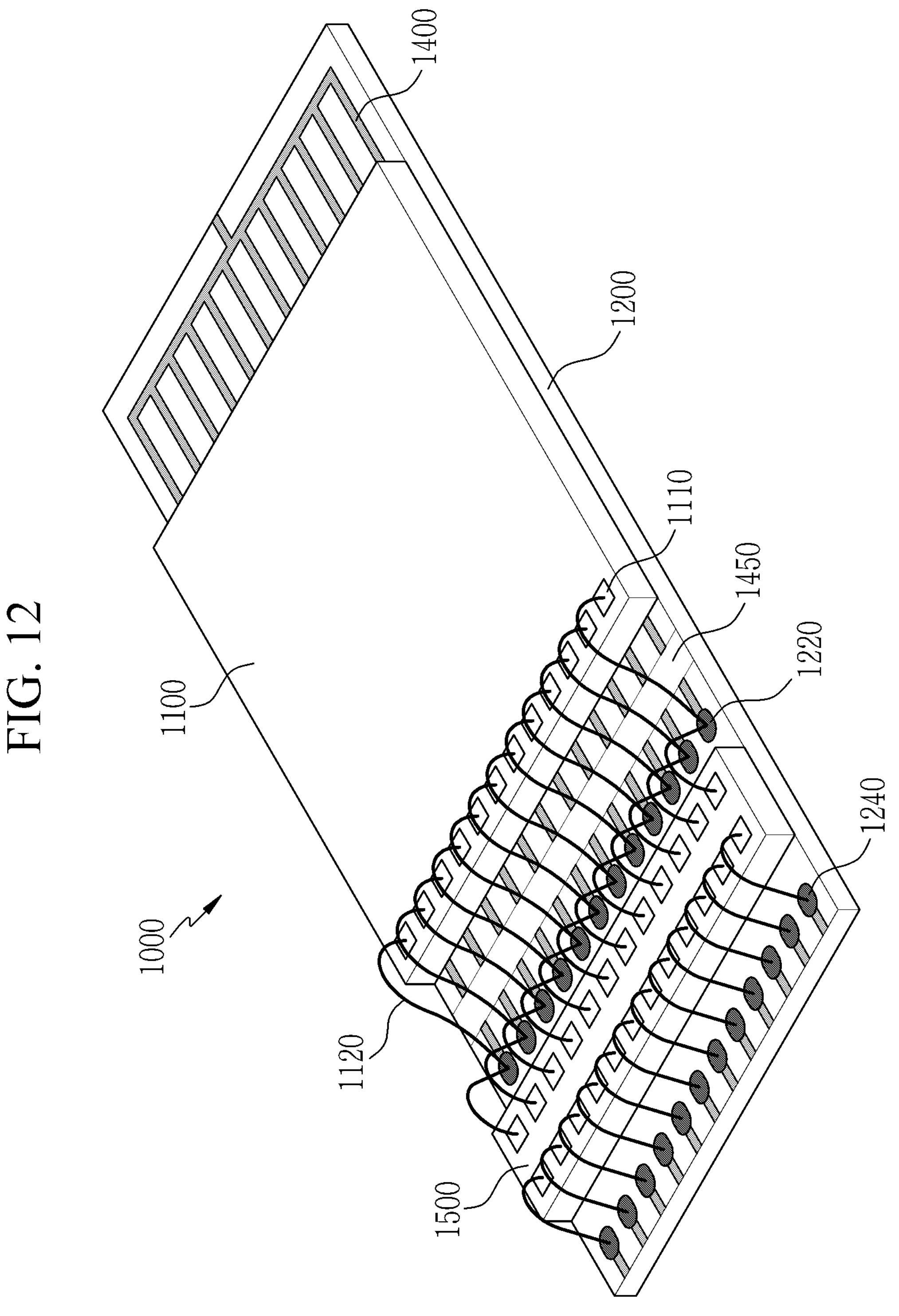
FIG. 12 is a view showing an embodiment of a semiconductor package including the substrate for the semiconductor package of FIG. 11.

FIG. 11 schematically shows a substrate for a semiconductor package according to another embodiment of the present disclosure. In the substrate 100 for the semiconductor package according to the present embodiment, after the plating line 140 is formed in the same manner as in the substrate for the semiconductor package of FIG. 8, the plating line removal region 145 is provided between the semiconductor chip mounting region 110 and the bonding terminal region 120. FIG. 12 shows a semiconductor package 1000 including the substrate for the semiconductor package of FIG. 11. The first semiconductor chip 1100 is mounted at the semiconductor chip mounting region 110, and the second semiconductor chip 1500 is mounted at the plating line prohibition region 130.

In the embodiments according to FIGS. 11 and 12, the plating line 140 extends below the first semiconductor chip, but a length of the plating line stub is relatively short because the plating line removal region 1450 is provided between the first semiconductor chip 1100 and the bonding terminals 1220. Because the length of the plating line stub is relatively short, a problem in which a signal characteristic is degraded due to a long plating line stub may not occur.

In a semiconductor package in which a relatively large semiconductor chip is mounted on a substrate having a limited size for compactization and high integration, the embodiments of the present disclosure may provide a substrate for the semiconductor package having a plating line that does not degrade or deteriorate a signal characteristic, does not weaken an adhesive force of the semiconductor chip, and has an arrangement of the plating line removal region. A semiconductor package including the substrate may be further provided.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

DESCRIPTION OF SYMBOLS

100, 1200: substrate
110: semiconductor chip mounting region
120, 120*a*, 120*b*: bonding terminal region
122, 1220, 1240: bonding terminal
130: plating line prohibition region
140, 140*a*, 140*b*, 1400: plating line
145: plating line removal region
1000, 1000', 1000": semiconductor package
1100, 1100': first semiconductor chip
1110: bonding pad
1120: wire
1500: second semiconductor chip

What is claimed is:

1. A semiconductor package comprising:

a substrate including a plurality of bonding terminals and a plating line on one surface of the substrate;

a first semiconductor chip that is mounted on the one surface of the substrate and includes a plurality of bonding pads formed near at least one edge on a top surface of the first semiconductor chip; and a second semiconductor chip that is mounted on the one surface of the substrate at a distance from the first semiconductor chip, and includes a plurality of bonding pads formed near at least one edge on a top surface of the second semiconductor chip, wherein, the plurality of bonding terminals are between the first semiconductor chip and the second semiconductor chip and are connected to the plurality of bonding pads of the first semiconductor chip and the plurality of bonding pads of the second semiconductor chip by wires, the plating line is between the plurality of bonding terminals and the first semiconductor chip and is connected to each of the plurality of bonding terminals, and a plating line removal region is between the first semiconductor chip and the plurality of bonding terminals and is free of a portion of the plating line so that each of the plurality of bonding terminals is electrically isolated.

2. The semiconductor package of claim 1, wherein the first semiconductor chip, the plurality of bonding terminals, and the second semiconductor chip are sequentially arranged in a length direction of the substrate, and the first semiconductor chip, the second semiconductor chip, and the substrate have substantially a same width.

3. The semiconductor package of claim 2, wherein the width of the first semiconductor chip is 80% or more of the width of the substrate.

4. The semiconductor package of claim 1, wherein a distance between the first semiconductor chip and the plurality of bonding terminals is 500 μm to 600 μm.

5. The semiconductor package of claim 4, wherein a width of the plating line removal region in a length direction of the substrate is 100 μm to 200 μm.

6. The semiconductor package of claim 5, wherein a length of the plating line that is connected to each of the plurality of bonding terminals is 200 μm or less.

7. The semiconductor package of claim 1, further comprising a plurality of second bonding terminals that are at an opposite side of the second semiconductor chip from the plurality of bonding terminals and are connected to a plurality of bonding pads of the second semiconductor chip by wires.

8. The semiconductor package of claim 1, wherein the plating line extends across a region of the top surface of the substrate in which the first semiconductor chip is mounted.

9. The semiconductor package of claim 1, wherein the first semiconductor chip is a memory chip, and the second semiconductor chip is a buffer chip.

10. The semiconductor package of claim 9, wherein the first semiconductor chip is a semiconductor chip stack, which comprises a plurality of memory chips stacked in a stepwise manner.

11. A semiconductor package comprising:

a substrate that includes connection terminals on a bottom surface that are configured for connection with an external device, bonding terminals on a top surface, which are connected to a semiconductor chip by wires, and via holes and conductive lines configured to facilitate electrical connections to the connection terminals and the bonding terminals; and a first semiconductor chip and a second semiconductor chip that are arranged along a length direction of the substrate and have substantially a same width as a width of the substrate, wherein, a plurality of bonding pads are arranged along a width direction of the first semiconductor chip near one edge of a top surface thereof facing the second semiconductor chip, a plurality of bonding pads are arranged along a width direction of the second semiconductor chip near one edge of a top surface thereof facing the first semiconductor chip, a plurality of bonding terminals are arranged along a width direction of the substrate between the first semiconductor chip and the second semiconductor chip, the plurality of bonding terminals are connected to the plurality of bonding pads of the first semiconductor chip and the plurality of bonding pads of the second semiconductor chip by wires, all of the plurality of bonding terminals are connected to at least one plating line, which is configured to supply electricity for electroplating, and is on the substrate between the plurality of bonding terminals and the first semiconductor chip, a plating line removal region, which is free of a portion of the at least one plating line, is between the first semiconductor chip and the plurality of bonding terminals to electrically separate the plurality of bonding terminals from each other, a distance between the second semiconductor chip and the plurality of bonding terminals is less than one-third of a distance between the first semiconductor chip and the plurality of bonding terminals, and the distance between the first semiconductor chip and the plurality of bonding terminals is 150 μm or more and the distance between the second semiconductor chip and the plurality of bonding terminals is 150 μm or less.

12. The semiconductor package of claim 11, wherein the distance between the first semiconductor chip and the plurality of bonding terminals is 500 μm to 600 μm, and a width of the plating line removal region along the length direction of the substrate is 100 μm to 200 μm.

13. The semiconductor package of claim 12, wherein a length of the at least one plating line that is connected to the plurality of bonding terminals is 200 μm or less.

14. The semiconductor package of claim 13, wherein, the first semiconductor chip is a memory chip and the second semiconductor chip is a buffer chip, a plurality of second bonding pads are arranged along the width direction of the buffer chip on a top surface thereof near another edge opposite to the one edge facing the first semiconductor chip, and and a plurality of second bonding terminals connected to the plurality of second bonding pads of the buffer chip by wires are arranged along the width direction of the substrate on the top surface of the substrate.

15. The semiconductor package of claim 14, wherein, the first semiconductor chip is a stack comprising eight NAND flash memory chips, which are stacked in a stepwise manner so that the bonding pads of each of the NAND flash memory chips are arranged toward the plurality of bonding terminals, the stack, the at least one plating line, the plating line removal region, the plurality of bonding terminals, the buffer chip, and the plurality of second bonding terminals constitute a first set, the semiconductor package further includes a second set that is adjacent to the first set and has a same configuration as the first set, and the first set and the second set are symmetrical to each other.

* * * * *